(12) United States Patent
Kang et al.

(10) Patent No.: US 12,079,482 B2
(45) Date of Patent: Sep. 3, 2024

(54) MEMORY DEVICE

(71) Applicant: Samsung Electronics Co., Ltd., Suwon-si (KR)

(72) Inventors: Shinhaeng Kang, Suwon-si (KR); Sukhan Lee, Seoul (KR); Kyomin Sohn, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 92 days.

(21) Appl. No.: 17/934,691

(22) Filed: Sep. 23, 2022

(65) Prior Publication Data

US 2023/0214124 A1 Jul. 6, 2023

(30) Foreign Application Priority Data

Jan. 6, 2022 (KR) .................. 10-2022-0001956
Apr. 22, 2022 (KR) .................. 10-2022-0049841

(51) Int. Cl.
*G11C 7/10* (2006.01)
*G06F 3/06* (2006.01)
*G11C 8/00* (2006.01)

(52) U.S. Cl.
CPC .......... *G06F 3/0613* (2013.01); *G06F 3/0629* (2013.01); *G06F 3/0673* (2013.01); *G11C 7/1006* (2013.01); *G11C 8/00* (2013.01)

(58) Field of Classification Search
CPC .... G06F 3/0613; G06F 3/0629; G06F 3/0673; G11C 7/1006; G11C 8/00; G11C 5/025; G11C 8/12; G11C 8/10
USPC ........................................ 365/189.02, 230.06
See application file for complete search history.

(56) References Cited

U.S. PATENT DOCUMENTS

| 5,917,764 | A  | * | 6/1999 | Ohsawa ................. | G11C 29/44 |
|           |    |   |        |                         | 365/189.07 |
| 6,687,785 | B1 | * | 2/2004 | Pereira .................... | G11C 15/00 |
|           |    |   |        |                         | 711/108 |
| 10,733,139 | B2 |  | 8/2020 | Li et al. | |
| 10,936,230 | B2 |  | 3/2021 | Debenedictis | |
| 11,094,371 | B2 |  | 8/2021 | O et al. | |
| 2002/0004923 | A1 | * | 1/2002 | Haraguchi ............. | G11C 29/40 |
|           |    |   |        |                         | 365/201 |
| 2009/0292862 | A1 | * | 11/2009 | Kitahara ............. | G06F 12/0246 |
|           |    |   |        |                         | 711/E12.008 |

(Continued)

FOREIGN PATENT DOCUMENTS

JP 5051215 B2 10/2012
KR 20190036358 A 4/2019

*Primary Examiner* — Michael T Tran
(74) *Attorney, Agent, or Firm* — Myers Bigel, P.A.

(57) ABSTRACT

A memory device includes a memory bank including a plurality of banks that comprise memory cells, and a PIM (processing in memory) circuit including a plurality of PIM blocks, each of the PIM blocks including an arithmetic logic unit (ALU) configured to perform an arithmetic operation using internal data acquired from at least one of the plurality of banks or an address generating unit. The plurality of PIM blocks include a first PIM block allocated to at least one first bank and a second PIM block allocated to at least one second bank. The address generating unit of the first PIM block is configured to generate a first internal row address for the at least one first bank, and the address generating unit of the second PIM block is configured to generate a second internal row address for the at least one second bank.

18 Claims, 15 Drawing Sheets

(56) References Cited

U.S. PATENT DOCUMENTS

| | | | |
|---|---|---|---|
| 2014/0281794 A1* | 9/2014 | Sakaue | G06F 11/1012 |
| | | | 714/758 |
| 2019/0096453 A1 | 3/2019 | Shin et al. | |
| 2021/0104291 A1* | 4/2021 | Kim | G11C 29/783 |
| 2021/0209022 A1 | 7/2021 | Song | |
| 2021/0216243 A1* | 7/2021 | Shin | G06F 3/0659 |
| 2023/0025899 A1* | 1/2023 | Song | G06F 7/4876 |

\* cited by examiner

MEMORY DEVICE

CROSS-REFERENCE TO RELATED APPLICATION(S)

This application claims the benefit under 35 USC 119(a) of Korean Patent Application No. 10-2022-0049841 filed on Apr. 22, 2022 and Korean Patent Application No. 10-2022-001956 filed on Jan. 6, 2022 in the Korean Intellectual Property Office, the entire disclosures of which are incorporated herein by reference for all purposes.

BACKGROUND

The present inventive concept relates to a memory device.

A memory device is a device for storing data and is employed in various systems. In addition to the memory device, a system may include an arithmetic processing device executing an arithmetic operation, and the arithmetic processing device may acquire data stored in the memory device and execute various arithmetic operations using the acquired data. However, since the arithmetic processing device has to execute an arithmetic operation after acquiring data from the memory device, the arithmetic processing speed may be lowered. In order to solve such a problem, a method of mounting a processing-in-memory (PIM) block capable of performing a partial arithmetic operation inside the memory device has been proposed.

SUMMARY

Example embodiments provide a memory device including a plurality of banks and a plurality of processing-in-memory (PIM) blocks, in which data is acquired by simultaneously accessing different addresses of the plurality of banks based on addresses respectively generated by the plurality of PIM blocks, in addition to an address received from an external host.

According to example embodiments, a memory device includes a memory bank including a plurality of banks that include memory cells, and a PIM (processing in memory) circuit including a plurality of PIM blocks, each of the PIM blocks including an arithmetic logic unit (ALU) configured to perform an arithmetic operation using internal data acquired from at least one of the plurality of banks or an address generating unit. The plurality of PIM blocks include a first PIM block allocated to at least one first bank and a second PIM block allocated to at least one second bank, the address generating unit of the first PIM block is configured to generate a first internal row address for the at least one first bank, the address generating unit of the second PIM block is configured to generate a second internal row address for the at least one second bank, and the first internal row address and the second internal row address indicate different rows.

According to example embodiments, a memory device includes a memory bank including at least one bank including memory cells, a PIM (processing in memory) circuit including a plurality of PIM blocks configured to perform arithmetic processing using at least one of external data received from an external host or internal data received from the memory bank, and a control logic configured to control the memory bank and the PIM circuit. Each of the plurality of PIM blocks is connected to at least one bank among the banks, is configured to generate an internal row address for the at least one bank that is connected, and configured to access a different row of each of the at least one bank with the internal row address.

According to example embodiments, a memory device includes a plurality of core dies stacked on each other and connected to each other through a plurality of channels by a plurality of through-silicon vias, and a buffer die configured to control the plurality of core dies through the plurality of channels. At least one of the plurality of core dies includes a plurality of banks respectively including a plurality of memory cells, and a plurality of PIM (processing in memory) blocks corresponding to the plurality of banks and configured to execute an arithmetic operation using data stored in at least one of the plurality of banks in response to a command received from the buffer die. Each of the plurality of PIM blocks is configured to independently generate a row address for accessing each of the plurality of banks to acquire the data in the arithmetic operation.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments will be described with reference to the accompanying drawings.

Figure 1:
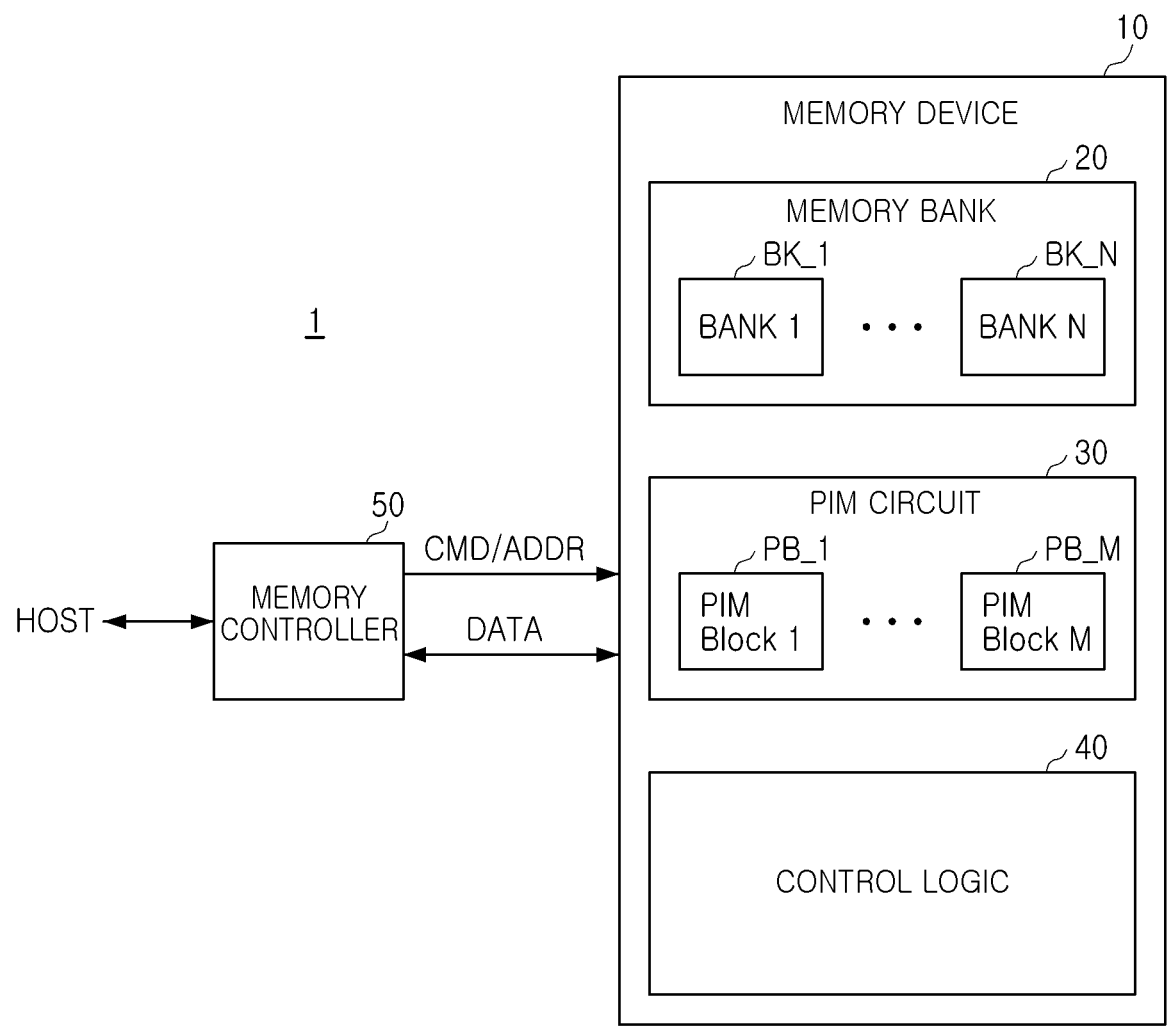
FIG. 1 is a schematic block diagram illustrating a memory system including a memory device according to example embodiments of the present inventive concept.

FIG. 1 is a schematic block diagram illustrating a memory system including a memory device according to example embodiments of the present inventive concept.

Referring to FIG. 1, a memory system 1 may include a memory device 10 and a memory controller 50. As an example, the memory system 1 may be included in desktop computers, laptop computers, smartphones, personal digital assistants (PDA), portable media players, tablet devices, wearable devices, and the like, but is not necessarily limited thereto.

The memory device 10 may be a dynamic random access memory (DRAM) such as DDR SDRAM (Double Data Rate Synchronous Dynamic Random Access Memory), LPDDR (Low Power Double Data Rate) SDRAM, GDDR (Graphics Double Data Rate) SDRAM, RDRAM (Rambus Dynamic Random Access Memory), etc. However, the present inventive concept is not necessarily limited thereto, and according to example embodiments, the memory device 10 may be a non-volatile memory such as a flash memory, a magnetic RAM (MRAM), a ferroelectric RAM (FeRAM), a phase change RAM (PRAM), and/or a resistive RAM (ReRAM).

The memory controller 50 may include a memory interface, and may transmit a signal for controlling an operation of the memory device 10 to the memory device 10 through the memory interface. For example, the memory controller 50 provides a control command CMD and an address ADDR to the memory device 10, and the memory device 10 may execute an operation indicated by the command CMD by referring to an address designated by the address ADDR.

The memory controller 50 may control the memory device 10 according to a request from the external host HOST. The memory controller 50 may communicate with the external host HOST using various protocols.

For example, the memory controller 50 may communicate with the external host HOST using an interface protocol such as peripheral component interconnect express (PCI-E), advanced technology attachment (ATA), serial ATA (SATA), parallel ATA (PATA), or serial attached SCSI (SAS). In addition, various other interface protocols such as universal serial bus (USB), multi-media card (MMC), enhanced small disk interface (ESDI), or integrated drive electronics (IDE) may be applied to the protocol between the external host HOST and the memory controller 50.

According to example embodiments, the memory controller 50 may be included in the external host HOST. In this case, the external host HOST may directly control the memory device 10.

The memory device 10 may include a memory bank 20, a PIM circuit 30, and control logic 40. The memory bank 20 may include a plurality of banks BK_1 to BK_N (here, N is a natural number equal to or greater than 2).

Each of the plurality of banks BK_1 to BK_N may include a row decoder, a column decoder, and a memory cell array including a plurality of memory cells. Each of the plurality of banks BK_1 to BK_N may include a plurality of word lines disposed in a row direction and may include a plurality of bit lines disposed in a column direction. The plurality of memory cells may be connected to the row decoder through a plurality of word lines and may be connected to the column decoder through bit lines.

The control logic 40 may receive the address ADDR and the control command CMD from the external host HOST. The address ADDR may include at least one of a row address indicating at least one of rows of the memory cell array included in each of the plurality of banks BK_1 to BK_N and a column address indicating at least one of columns of the memory cell array included in each of the plurality of banks BK_1 to BK_N. The row decoder of each of the plurality of banks BK_1 to BK_N may select at least one of a plurality of word lines by referring to a row address, and the column decoder of each of the plurality of banks BK_1 to BK_N may select at least one of a plurality of bit lines by referring to a column address.

The PIM circuit 30 may include a plurality of PIM blocks PB_1 to PB_M (here, M is a natural number greater than or equal to 2), and each of the plurality of PIM blocks PB_1 to PB_M may be disposed to correspond to the plurality of banks BK_1 to BK_N, respectively. In other words, the first PIM block PB_1 may be disposed to correspond to the first bank BK_1, the second PIM block PB_2 may be disposed to correspond to the second bank BK_2, and the M-th PIM block PB_M may be disposed to correspond to the N-th bank BK_N. In this case, M may be the same value as N.

However, the present inventive concept is not necessarily limited thereto, and according to example embodiments, a plurality of banks may be disposed to correspond to one PIM block, and a plurality of PIM blocks may be disposed to correspond to one bank. For example, at least two of the plurality of banks BK_1 to BK_N may share one of the plurality of PIM blocks PB_1 to PB_M.

Each of the plurality of PIM blocks PB_1 to PB_M may perform an arithmetic processing using internal data acquired from at least one of the plurality of banks BK_1 to BK_N. In addition, each of the plurality of PIM blocks PB_1 to PB_M may generate row addresses for each of the plurality of banks BK_1 to BK_N.

For example, each of the plurality of PIM blocks PB_1 to PB_M may include an address generating unit generating at least one of a row address and a column address. The address generating unit may generate at least one of a row address and a column address using at least one of external data DATA received from the external host HOST and internal data acquired from at least one of the plurality of banks BK_1 to BK_N. In this case, the external data DATA may include address information for at least one of a row address and a column address, and the external data DATA including the address information may be transmitted through a data pad of the memory device 10.

In example embodiments of the present inventive concept, one of the address ADDR received from the external host HOST and the address generated in each of the PIM blocks PB_1 to PB_M may be selected and used according to an operation mode of the memory device 10. For example, in the case of accessing the plurality of banks BK_1 to BK_N by referring to the address ADDR received from the external host HOST, the same row and/or column of each of the plurality of banks BK_1 to BK_N may be accessed at the same time.

In example embodiments of the present inventive concept, a row address and/or a column address may be directly generated in each of the PIM blocks PB_1 to PB_M disposed to correspond to the plurality of banks BK_1 to BK_N, so that different rows and/or columns of each of the plurality of banks BK_1 to BK_N may be simultaneously accessed.

Accordingly, since access to different rows and/or columns may be simultaneously executed in each of the plurality of banks BK_1 to BK_N, data access patterns may be diversified. In addition, since data stored in different rows and/or columns of each of the plurality of banks BK_1 to BK_N may be read at the same time, a time required for a read operation READ may be shortened, thereby improving an arithmetic operation processing speed of the PIM circuit 30 and improving power consumption.

Figure 2:
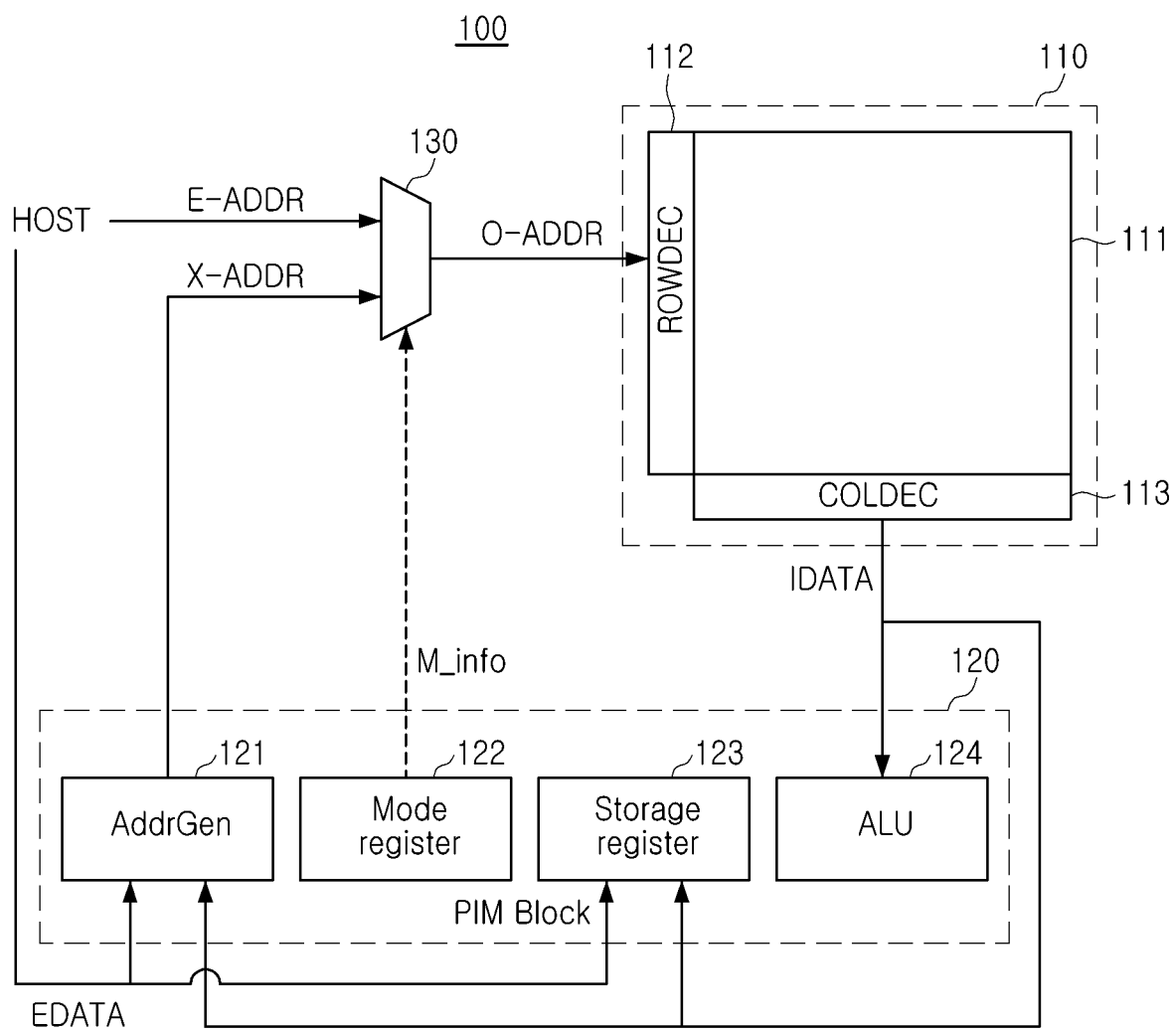
FIG. 2 is a diagram schematically illustrating a memory device according to example embodiments of the present inventive concept.

FIG. 2 is a diagram schematically illustrating a memory device according to example embodiments of the present inventive concept.

Referring to FIG. 2, a memory device 100 according to example embodiments of the present inventive concept may include a bank 110, a PIM block 120, and a multiplexer 130. The bank 110 may include a memory cell array 111 including a plurality of memory cells, a row decoder 112, and a column decoder 113, and the PIM block 120 may include an address generating unit 121, a mode register 122, a storage register 123, and an arithmetic logic unit (ALU) 124.

For example, the bank 110 may be one of the plurality of banks BK_1 to BK_N according to the example embodiment illustrated in FIG. 1. The bank 110 may include a plurality of word lines arranged in a row direction and a plurality of bit lines arranged in a column direction. The plurality of memory cells may be connected to the row decoder 112 through word lines, and may be connected to the column decoder 113 through a plurality of bit lines.

The PIM block 120 may be one of the plurality of PIM blocks PB_1 to PB_M according to the example embodiment illustrated in FIG. 1. In the example embodiment illustrated in FIG. 2, one PIM block 120 is allocated to one bank 110, but a matching relationship between the bank 110 and the PIM block 120 is not necessarily limited thereto and may vary according to example embodiments. Hereinafter, for convenience, example embodiments in which one PIM block 120 is allocated to one bank 110 will be described.

The address generating unit 121 may generate an internal row address X-ADDR using at least one of external data EDATA received from the external host HOST and internal data IDATA received from the bank 110. According to example embodiments, at least one of the external data EDATA received from the external host HOST and the internal data IDATA acquired from the bank 110 may be temporarily stored in the storage register 123. The address generating unit 121 may generate the internal row address X-ADDR by acquiring at least one of the external data EDATA and the internal data IDATA stored in the storage register 123 if necessary.

An external row address E-ADDR received from the external host HOST may be input to the multiplexer 130, and the address generating unit 121 may generate an internal row address X-ADDR and input the generated internal row address X-ADDR to the multiplexer 130. The multiplexer 130 may select one of the external row address E-ADDR and the internal row address X-ADDR and output the selected address to the row decoder 112 as an output address O-ADDR.

The mode register 122 may store mode information M_info, and the mode information M_info may be used by the multiplexer 130 to select one of the external row address E-ADDR and the internal row address X-ADDR. The external host HOST may control a value of the mode information M_info output from the mode register 122 through an input/output circuit. In other words, the multiplexer 130 may select one of the external row address E-ADDR and the internal row address X-ADDR using the mode information M_info provided from the mode register 122 and output the selected address to the row decoder 112. Accordingly, the row decoder 112 may select at least one of the word lines connected to the memory cell array 111 by referring to one of the external row address E-ADDR provided from the external host HOST and the internal row address X-ADDR generated by the address generating unit 121 of the PIM block 120.

Meanwhile, the ALU 124 may perform various arithmetic operations using the internal data IDATA acquired from the bank 110. For example, the ALU 124 may perform arithmetic operations such as data inversion, data shift, data swap, data comparison, logical operations such as AND and XOR, and numerical operations such as addition and subtraction.

Figure 3:
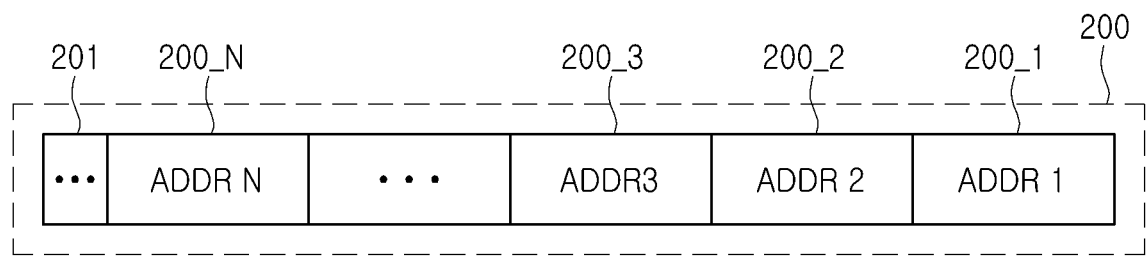
FIG. 3 is a diagram schematically illustrating data included in a semiconductor device according to example embodiments of the present inventive concept.

FIG. 3 is a diagram schematically illustrating data included in a semiconductor device according to an example embodiment of the present inventive concept.

The data 200 according to the example embodiments illustrated in FIG. 3 may be one of external data EDATA acquired from the external host HOST and the internal data IDATA acquired from the bank 110, and will be described with reference to FIG. 2 together. As described above, the external data EDATA transmitted from the external host HOST may be received by the address generating unit 121 and/or the storage register 123. Also, the address generating unit 121 and/or the storage register 123 may receive the internal data IDATA from the bank 110.

When the data 200 illustrated in FIG. 3 is the external data EDATA received from the external host HOST, the data 200 may include a plurality of row addresses and/or a plurality of column addresses. The external data EDATA may be received through a data pad for exchanging data signals among the pads of the memory device 100 connected to the external host HOST, and may include a plurality of addresses 200_1 to 200_N.

For example, the external row address E-ADDR output from the external host HOST may include 14 bits of information, and in this case, the memory cell array 111 may include $2^{14}$ rows. The external data EDATA provided by the external host HOST may include 256 bits of information. The external host HOST may provide a plurality of row addresses and/or column addresses through the external data EDATA exchanged to and from the data pad. In this case, up to 18 row addresses may be provided in one external data EDATA.

According to example embodiments, the data 200 may include a dummy bit between the plurality of addresses 200_1 to 200_N, and a remaining portion 201, except for the plurality of addresses 200_1 to 200_N, may include at least one of a dummy bit and an end instruction.

According to example embodiments, the data 200 may be internal data IDATA acquired from the bank 110, and in this case, the data 200 may include the same 256-bit information as in the case of the external data EDATA. As described above, the data 200 may include a plurality of addresses 200_1 to 200_N, and according to example embodiments, at least one dummy bit may be included between the plurality of addresses 200_1 to 200_N. The portion 201 of the data 200 excluding the plurality of addresses may include at least one of at least one dummy bit and an end instruction.

Figure 4:
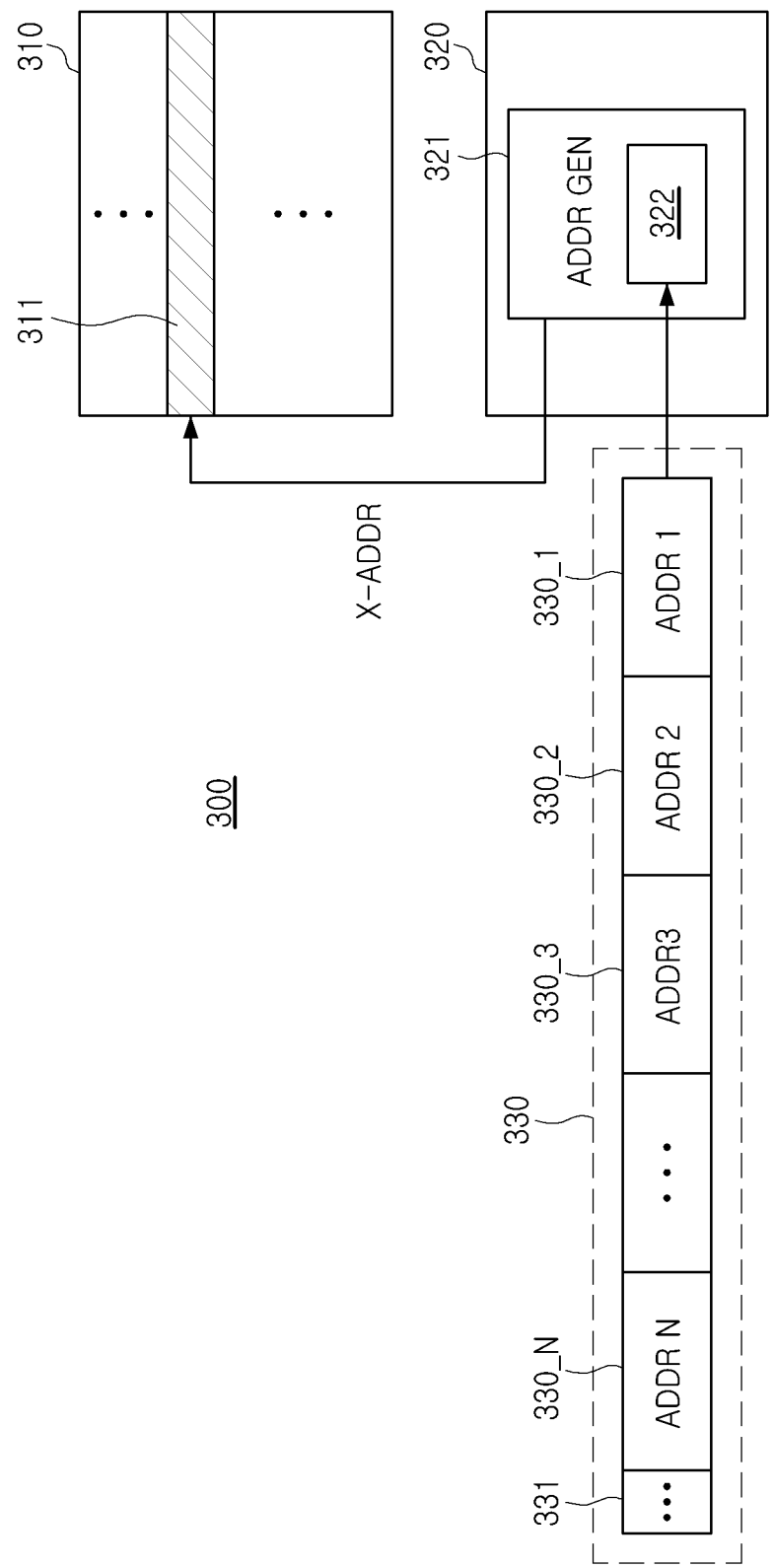
FIG. 4 is a diagram illustrating an operation of a memory device according to example embodiments of the present inventive concept.

FIG. 4 is a diagram illustrating an operation of a memory device according to example embodiments of the present inventive concept.

Referring to FIG. 4, a memory device 300 may include a bank 310 with a memory cell 311 and a PIM block 320, and the PIM block 320 may include an address generating unit 321. For example, each of the bank 310, the PIM block 320, and the address generating unit 321 may be understood according to the example embodiments described with reference to FIG. 2.

The address generating unit 321 may receive data 330, and the data 330 may be the data 200 described with reference to FIG. 3. In other words, the data 330 may be one of the external data EDATA received from the external host HOST and the internal data IDATA acquired from the bank 310 and may include a plurality of addresses 330_1 to 330_N.

The address generating unit 321 may sequentially receive the plurality of addresses 330_1 to 330_N included in the data 330. For example, the address generating unit 321 may receive a first address ADDR1 and generate an internal row address X-ADDR using the first address 300_1, and output the generated internal row address X-ADDR to the bank 310.

The address generating unit 321 that generates the internal row address X-ADDR using the first address 330_1 may receive a second address 300_2 next, and may output the generated internal row address X-ADDR to the bank 310 using the second address 300_2. Thereafter, the address generating unit 321 may receive the third address 300_3 and generate an internal row address X-ADDR. A structure of the data 330 may be understood with reference to the example embodiments described above with reference to FIG. 3. However, according to the example embodiments, whether or not there are dummy bits, the number of dummy bits, whether or not there is an end instruction, and an order of reading the plurality of addresses 300_1-300_N from the data 330 may vary.

Figure 5:
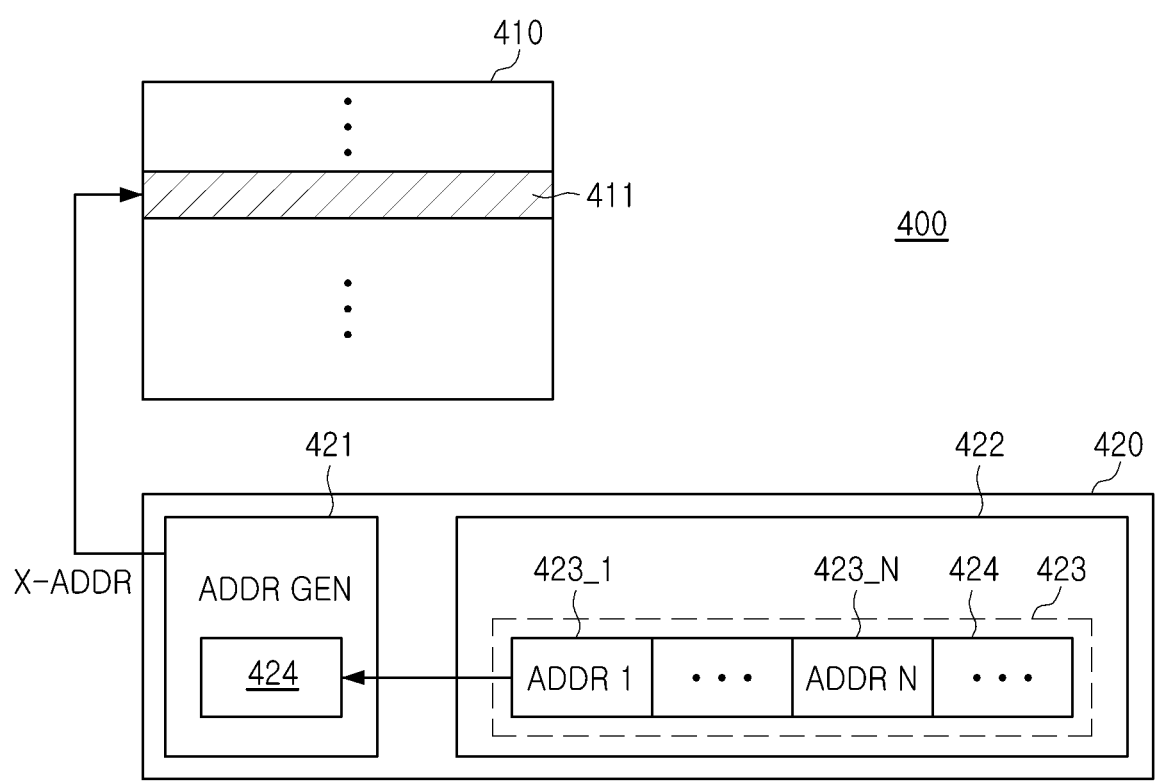
FIG. 5 is a diagram illustrating an operation of a memory device according to example embodiments of the present inventive concept.

FIG. 5 is a diagram illustrating an operation of a memory device according to example embodiments of the present inventive concept.

Referring to FIG. 5, a memory device 400 according to example embodiments of the present inventive concept may include a bank 410 with a memory cell 411 and a PIM block 420, and the PIM block 420 may include an address generating unit 421, a storage register 422, and the like. For example, each of the bank 410, the PIM block 420, the address generating unit 421, and the storage register 422 may be one of the bank 110, the PIM block 120, the address generating unit 121, and the storage register 123 described with reference to FIG. 2. Hereinafter, this will be described with reference to FIG. 2.

The storage register 422 may store data 423. The data 423 may be one of external data EDATA received from the external host HOST and internal data IDATA acquired from the bank 410. For example, the data 423 may be the data 200 described with reference to FIG. 3. Accordingly, the data 423 may include at least one of a plurality of row addresses 423_1 to 423_N, a dummy bit, and an end instruction.

The address generating unit 421 may generate an internal row address X-ADDR using the data 423 stored in the storage register 422 when necessary. As described with reference to FIG. 4, the address generating unit 421 may generate the internal row address X-ADDR by sequentially using the plurality of addresses 423_1 to 423_N stored in the data 423.

Figure 6:
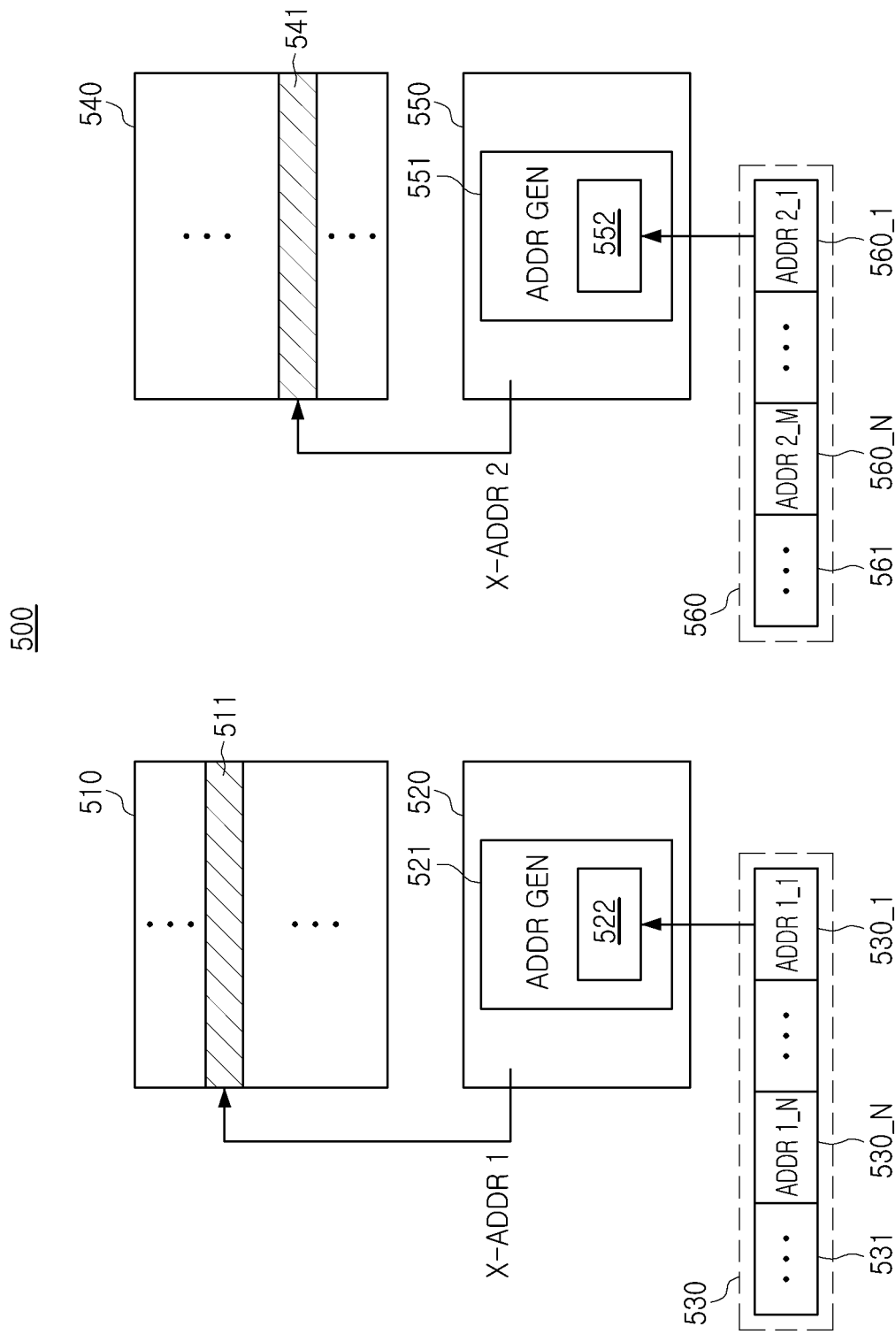
FIG. 6 is a diagram schematically illustrating an operation of a memory device according to example embodiments of the present inventive concept.

FIG. 6 is a diagram schematically illustrating an operation of a memory device according to example embodiments of the present inventive concept.

Referring to FIG. 6, a memory device 500 according to an example embodiment of the present inventive concept may include a first bank 510 with a first memory cell 511, a first PIM block 520, a second bank 540 with a second memory cell 541, and a second PIM block 550. The first PIM block 520 may include a first address generating unit 521, and the second PIM block 550 may include a second address generating unit 551. A description of a structure and operation of the first and second address generating units 521 and 551 may be understood with reference to the example embodiments described above with reference to FIGS. 2 to 5.

The first address generating unit 521 may receive first data 530, and the second address generating unit 551 may receive second data 560. The first data 530 may be one of external data EDATA received from the external host HOST and internal data IDATA acquired from the first bank 510, and the second data 560 may be one of the external data EDATA received from the external host HOST and the internal data IDATA acquired from the second bank 540.

The first data 530 and the second data 560 may have a structure similar to the data 200 described with reference to FIG. 3. The first data 530 may include at least one of a plurality of addresses 530_1 to 530_N, a dummy bit, and an end instruction, and the second data 560 may include at least one of a plurality of addresses 560_1 to 560_N, a dummy bit, and an end instruction. Each of the first address generating unit 521 and the second address generating unit 551 may sequentially receive the first data 530 and the second data 560, respectively, or may simultaneously receive the first data 530 and the second data 560 according to example embodiments.

While the first address generating unit 521 outputs a first internal row address X-ADDR1 using one address 522 among the plurality of addresses 530_1 to 530_N included in the first data 530, the second address generating unit 551 may output the second internal row address X-ADDR2 using one address 552 among the plurality of addresses 560_1 to 560_N included in the second data 560. Since the plurality of addresses 530_1 to 530_N included in the first data 530 and the plurality of addresses 560_1 to 560_N included in the second data 560 may be different from each other, rows indicated by each of the first and second internal row addresses X-ADDR1 and X-ADDR2 may also be different.

Since the row of the first bank 510 indicated by the first internal row address X-ADDR1 and the row of the second bank 540 indicated by the second internal row address X-ADDR2 may be different from each other, data access patterns may be diversified, and since a row to be accessed for each bank may be accessed at the same time, time and power consumption required for a read operation of the memory device may be improved.

Figure 7A:
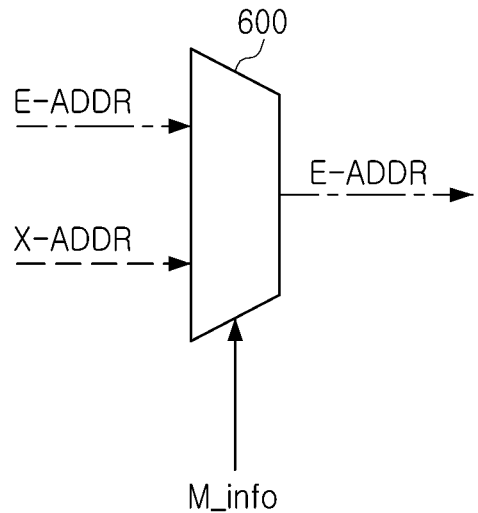
FIGS. 7A and 7B are diagrams schematically illustrating a multiplexer included in a memory device according to example embodiments of the present inventive concept.
Figure 7B:
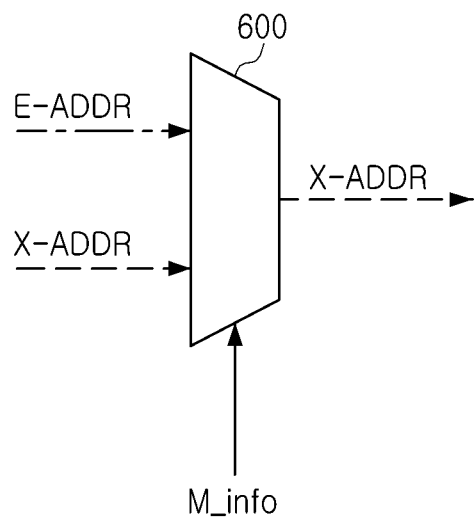

FIGS. 7A and 7B are diagrams schematically illustrating a multiplexer included in a memory device according to example embodiments of the present inventive concept.

For example, a multiplexer 600 illustrated in FIGS. 7A and 7B may be the multiplexer 130 described with reference to FIG. 2. Hereinafter, this will be described with reference to FIG. 2 together.

Referring to FIGS. 7A and 7B, the multiplexer 600 may receive the external row address E-ADDR provided from the external host HOST, the internal row address X-ADDR provided from a PIM block, and mode information M_info provided from a mode register.

The multiplexer 600 may select one of the external row address E-ADDR and the internal row address X-ADDR according to a value of the mode information M_info and output the selected address to the row decoder, and the external host HOST may control the value of the mode information M_info output from the mode register through an input/output circuit of the memory device.

For example, the mode information M_info may be a binary value including 1 bit. In a storage mode for storing data in the memory device, the external host may control the mode register to output mode information M_info having a value of 0. In this case, as illustrated in FIG. 7A, the multiplexer 600 may select the external row address E-ADDR and output the selected external row address E-ADDR to the row decoder 112.

Meanwhile, in the case of an arithmetic operation mode for arithmetically operating internal data stored in the bank, the external host may control the mode register to output the mode information M_info having a value of 1, and in this case, as illustrated in FIG. 7B, the multiplexer 600 may select the internal row address X-ADDR and output the selected internal row address X-ADDR to the row decoder.

However, the present inventive concept is not necessarily limited thereto, and a value that the mode information M_info may have and an address that may be selected according to the value of the mode information M-info may vary according to example embodiments.

Figure 8:
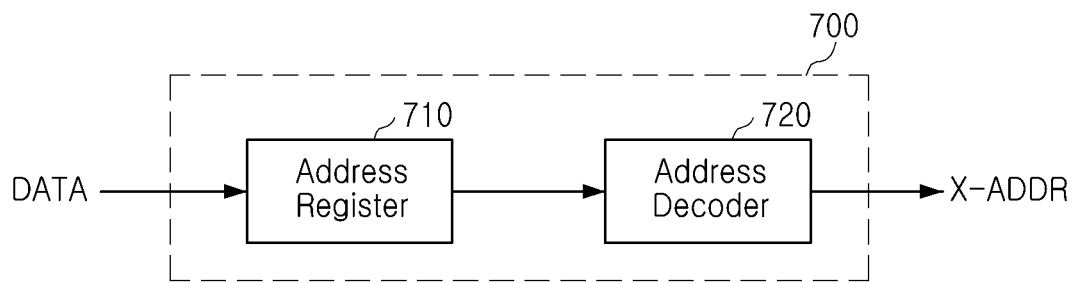
FIG. 8 is a diagram schematically illustrating an address generating unit included in a memory device according to example embodiments of the present inventive concept.

FIG. 8 is a diagram schematically illustrating an address generating unit included in a memory device according to example embodiments of the present inventive concept.

Referring to FIG. 8, the address generating unit 700 may include an address register 710 and an address decoder 720. As an example, FIG. 8 may be a diagram schematically illustrating at least one of the address generating units described with reference to FIGS. 1 to 7.

The address register 710 may store and/or output information on a row address indicating a row of a bank. The address register 710 may receive data DATA, and the data DATA may be one of external data received from an external host and internal data acquired from a bank. The address register 710 may output data for an internal row address to the address decoder 720 using the received data DATA.

In the address register 710, data for a specific row address to be accessed in the bank, not every row address existing in the bank, may be selectively stored, which may be different for each address register of each of a plurality of PIM blocks disposed to correspond to each of the plurality of banks. Accordingly, by storing different data DATA in the address register 710 of each of the plurality of PIM blocks respectively corresponding to each of the plurality of banks and receiving different data DATA for each address register 710, different rows may be accessed for each of the plurality of banks.

Figure 9:
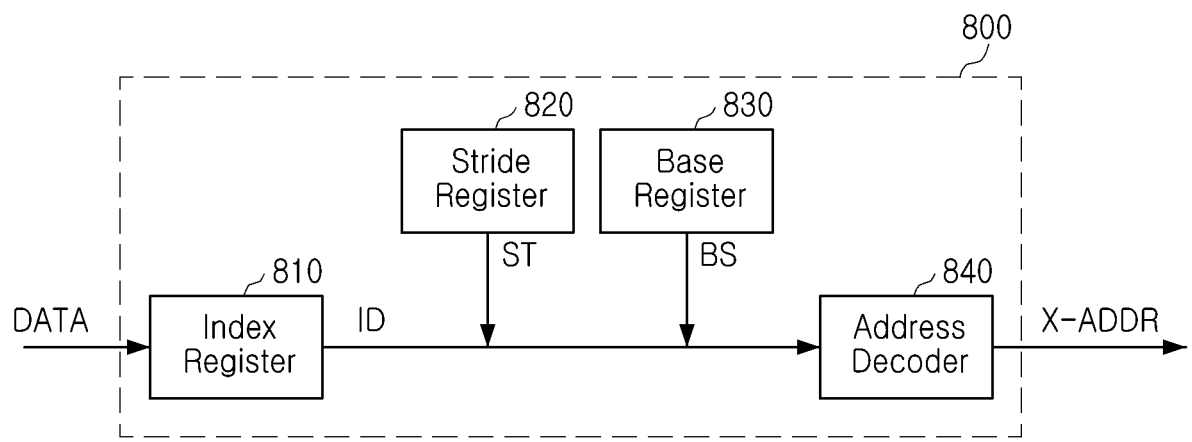
FIG. 9 is a diagram schematically illustrating an address generating unit included in a memory device according to example embodiments of the present inventive concept.

FIG. 9 is a diagram schematically illustrating an address generating unit included in a memory device according to example embodiments of the present inventive concept.

Referring to FIG. 9, the address generating unit 800 may include an index register 810, a stride register 820, a base register 830, and an address decoder 840. As an example, FIG. 9 may be a diagram simply illustrating at least one of the address generating units described with reference to FIGS. 1 to 7. Hereinafter, this will be described with reference to FIG. 2 together.

The index register 810 may store information corresponding to a row address of a row in which data to be read from the bank exists. The index register 810 may receive data DATA, and the data DATA may be at least one of external data EDATA received from the external host HOST and internal data DATA acquired from a bank. The index register 810 may output an index value ID using data DATA.

Each of the stride register 820 and the base register 830 may store information for calculating a row address for a row to be accessed in the bank 110. The stride register 820 may output a stride value ST, and the base register 830 may output a base value BS. The address decoder 840 may receive a value obtained by arithmetically operating the index value ID, the stride value ST, and the base value BS, and output the internal row address X-ADDR.

For example, the address decoder 840 may receive a value obtained by multiplying the index value ID by the stride value ST and adding the base value BS thereto. In other words, when one of the values stored in the index register 810 is I, one of the values stored in the stride register 820 is S, and one of the values stored in the base register 830 is B, the internal row address X-ADDR generated by the address generating unit 800 may correspond to the I*S+B value (i.e., I logical AND S logical OR B).

When the data to be accessed in the bank is stored at regular intervals, a value corresponding to the regular interval may be stored in the stride register 820, and the index value ID corresponding to the row in which the data to be accessed exists may be stored in the index register 810. The base value BS may have a value corresponding to a first row among a plurality of rows including data distributed at regular intervals.

The address generating unit 800 illustrated in FIG. 9 may not store the entire row addresses of the row to be accessed, but generate the the internal row address X-ADDR using the index value ID, the stride value ST, and the base value BS, thereby reducing the amount of data stored in the address generating unit 800.

In addition, according to example embodiments, the address generating unit 800 may include an offset register storing offset information, may receive a reference address and a control command from the external host HOST, and may generate an internal row address X-ADDR based on the reference address and an offset address.

Figure 10:
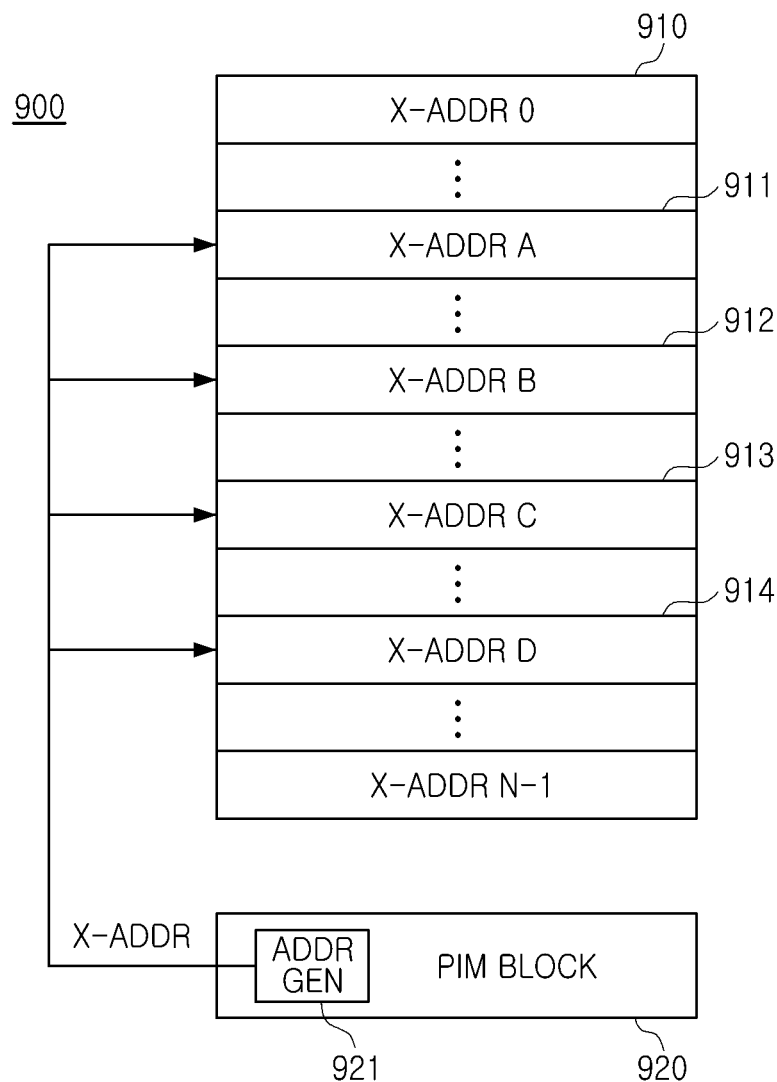
FIG. 10 is a diagram illustrating an operation of a memory device according to example embodiments of the present inventive concept.

FIG. 10 is a diagram illustrating an operation of a memory device according to example embodiments of the present inventive concept.

The memory device 900 may include a bank 910 and a PIM block 920, and the PIM block 920 may include an address generating unit 921. For example, the address generating unit 921 may be the address generating unit 800 described with reference to FIG. 9. Hereinafter, it will be described with reference to FIG. 9 together.

The bank 910 may include a plurality of rows, and data to be accessed may be stored in a plurality of rows 911 to 914 at regular intervals, and the plurality of rows 911 to 914 in which data is stored may correspond to a plurality of internal row addresses X-ADDR A to X-ADDR D. In the example embodiments illustrated in FIG. 10, data to be accessed is stored in four rows 911 to 914, but the present inventive concept is not limited thereto, and the number and arrangement of rows in which the data to be accessed are stored may vary according to example embodiments.

As an example, rows in which data to be accessed in the bank 910 exist may be 7th, 12th, 17th, 22nd, and 27th rows. In this case, {0, 1, 2, 3, 4} values may be stored in the index register 810 to access the above rows. The stride register 820 may store {5} corresponding to the interval between the rows in which data exists, and the base register 830 may store {7} corresponding to the first row address among the row addresses to be accessed.

The index register 810 may output one of {0, 1, 2, 3, 4} values as the index value ID according to the received data DATA. The output value may be multiplied by 5, which is a stride value output from the stride register 820, and then may be added to the base value 7 that is output from the base register 830. After receiving the arithmetically operated value, the address decoder 840 may output the internal row address X-ADDR to the bank.

Figure 11:
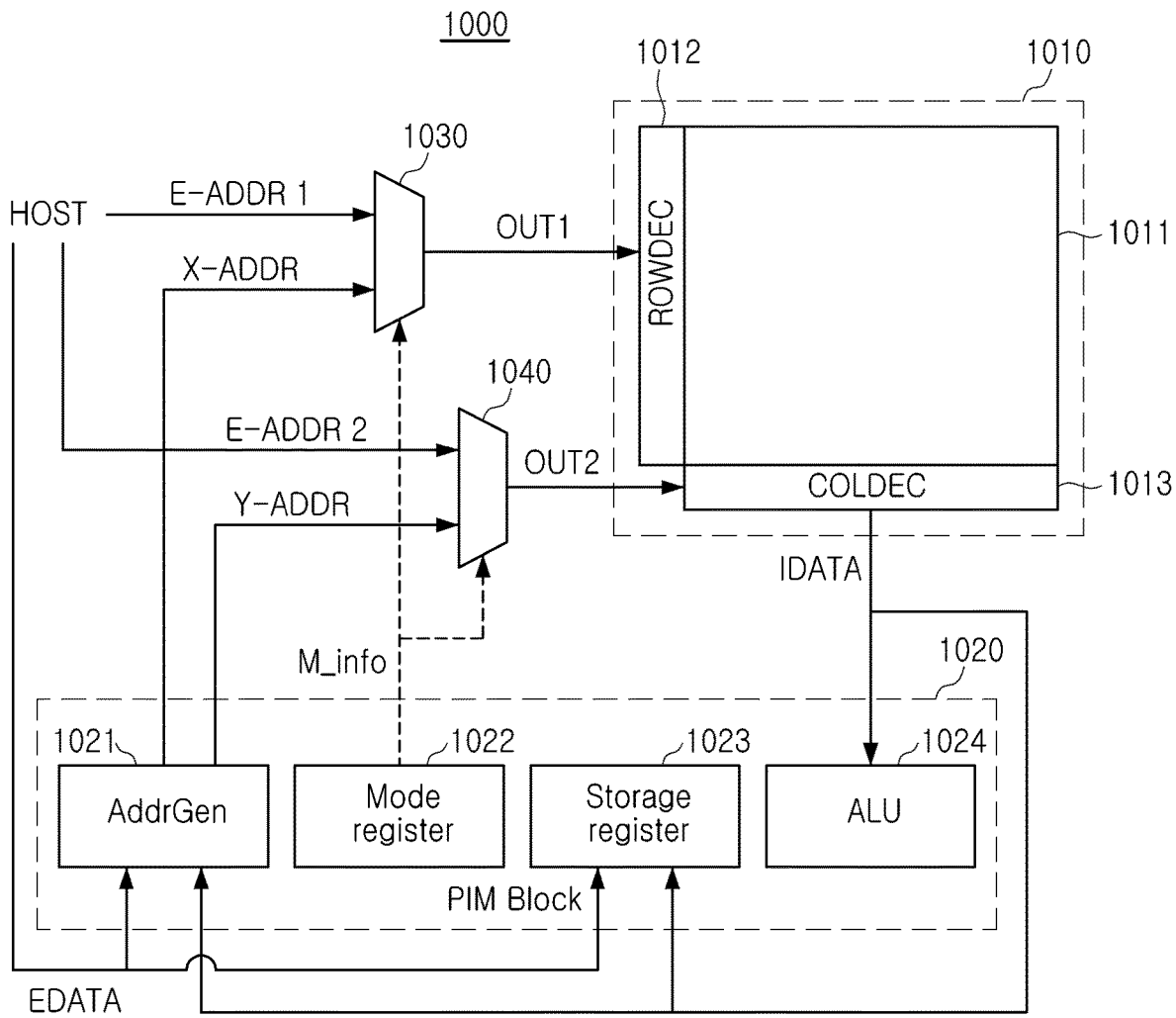
FIG. 11 is a diagram schematically illustrating a memory device according to example embodiments of the present inventive concept.

FIG. 11 is a diagram schematically illustrating a memory device according to example embodiments of the present inventive concept.

Referring to FIG. 11, a memory device 1000 according to example embodiments of the present inventive concept may include a bank 1010, a PIM block 1020, a first multiplexer 1030, and a second multiplexer 1040. The bank 1010 may include a memory cell array 1011, a row decoder 1012, and a column decoder 1013, and the PIM block 1020 may include an address generating unit 1021, a mode register 1022, a storage register 1023, and an ALU 1024.

The external host HOST may output an external row address E-ADDR1 to the first multiplexer 1030 and may output an external column address E-ADDR2 to the second multiplexer 1040. The address generating unit 1021 may output an internal row address X-ADDR to the first multiplexer 1030 and may output an internal column address Y-ADDR to the second multiplexer 1040.

The first multiplexer 1030 may select one of the external row address E-ADDR1 and the internal row address X-ADDR and output the selected address, as a first output address OUT1, to the row decoder 1012, and the second multiplexer 1040 may select one of the external column address E-ADDR2 and the internal column address Y-ADDR and output the selected address, as a second output address OUT2, to the column decoder 1013. The mode register 1022 may store mode information M_info. The mode information M_info may be used by the first multiplexer 1030 to select one of the external row address E-ADDR1 and the internal row address X-ADDR and may be used by the second multiplexer 1040 to select one of the external column address E-ADDR2 and the internal column address Y-ADDR. The external host HOST may control the mode register 1022 to output predetermined mode information M_info.

For example, when the external host HOST arithmetically operates data acquired from the bank 1010 or accesses the same row and/or column in each of a plurality of banks, the external host HOST may control the mode register 1022 to output a predetermined mode information M_info value so that the first multiplexer 1030 selects the external row address E-ADDR1 and the second multiplexer 1040 selects the external column address E-ADDR2. Meanwhile, when the memory device 1000 accesses different rows and/or columns in each of the plurality of banks, the external host HOST may control the mode register 1022 to output the predetermined mode information M_info so that the first multiplexer 1030 selects the internal row address X-ADDR and the second multiplexer 1040 selects the internal column address Y-ADDR.

Accordingly, the row decoder 1012 may select at least one of a plurality of word lines by referring to one of the external row address E-ADDR1 provided from the external host HOST and the internal row address X-ADDR generated by the address generating unit 1021 of the PIM block 1020, and the column decoder 1013 may select at least one of a plurality of bit lines by referring to one of the external column address E-ADDR2 provided from the external host HOST and the internal column address Y-ADDR generated by the address generating unit 1021 of the PIM block 1020.

According to an example embodiment illustrated in FIG. 11, by generating the internal row address X-ADDR and the internal column address Y-ADDR inside the PIM block, data to be accessed in the bank 1010 may be accessed more quickly and power consumption may be improved.

The structure and/or operation of the storage register 1023 and the ALU 1024 may be understood with reference to the example embodiment described above with reference to FIG. 12 is a diagram schematically illustrating an address generating unit included in a memory device according to example embodiments of the present inventive concept.

Figure 12:
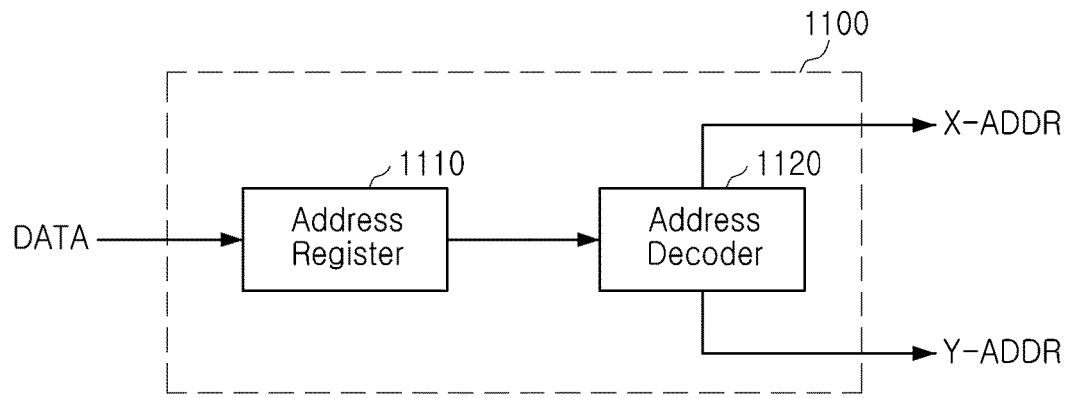
FIG. 12 is a diagram schematically illustrating an address generating unit included in a memory device according to example embodiments of the present inventive concept.

Referring to FIG. 12, an address generating unit 1100 may include an address register 1110 and an address decoder 1120. As an example, FIG. 12 may be a diagram simply illustrating the address generating unit 1021 illustrated in FIG. 11, and the structures and operations of the address register 1110 and the address decoder 1120 illustrated in FIG. 12 may be similar to the address generating unit described in FIG. 8. Hereinafter, it will be described with reference to FIG. 11 together.

The address register 1110 may receive data DATA, and as described with reference to FIG. 3, the data DATA may be one of external data EDATA received from the external host HOST and internal data IDATA acquired from the bank 1010. The data DATA may include at least one row address and at least one column address, and may include a dummy bit and an end instruction.

For example, the external row address E-ADDR1 output from the external host HOST may include 14 bits of information, and in this case, the memory cell array may include $2^{14}$ rows. The external column address E-ADDR2 output from the external host HOST may include 5 bits of information, and in this case, the memory bank 1010 may include $2^5$ columns. The external data EDATA provided by the external host HOST may include 256 bits of information.

The external host HOST may provide a plurality of row addresses and a plurality of column addresses through the external data DATA, rather than the internal row address X-ADDR and the internal column address Y-ADDR. When a row address and a column address for reading one data from the memory cell array 1011 form one set address, the one set address may include 19 bits of information. In this case, up to 13 set addresses may be provided for one data DATA.

Accordingly, when the external host HOST provides a plurality of row addresses and a plurality of column addresses through the external data EDATA, at least one data stored in different columns and/or different rows in the bank 1010 may be accessed with the external data EDATA once.

The address register 1110 may store and/or output information on a row address indicating a row of the bank 1010 and information on a column address indicating a column of the bank 1010. The address register 1110 may receive at least one of the external data EDATA received from the external host HOST and the internal data IDATA acquired from the bank 1010, and output information on a row address and a column address to the address decoder 1120 using the received data.

Data for a specific row address and column address to be accessed in the bank 1010, rather than all row addresses and column addresses existing in the bank 1010, may be selectively stored in the address register 1110, which may be different for each address register 1110 of the PIM block disposed to correspond to each of the plurality of banks. Accordingly, by storing different information in the address register 1110 of each of the plurality of PIM blocks corresponding respectively to the plurality of banks and receiving different data DATA for each address register 1110, different row and/or columns of each of the plurality of banks may be accessed.

However, the present inventive concept is not necessarily limited thereto, and the number of rows and columns included in the memory cell array 1011 of the bank 1010 may vary according to example embodiments, and the number of bits that may be included in the address and data DATA may also vary. Accordingly, the number of row addresses and column addresses that may be included in the data DATA may also vary.

Figure 13:
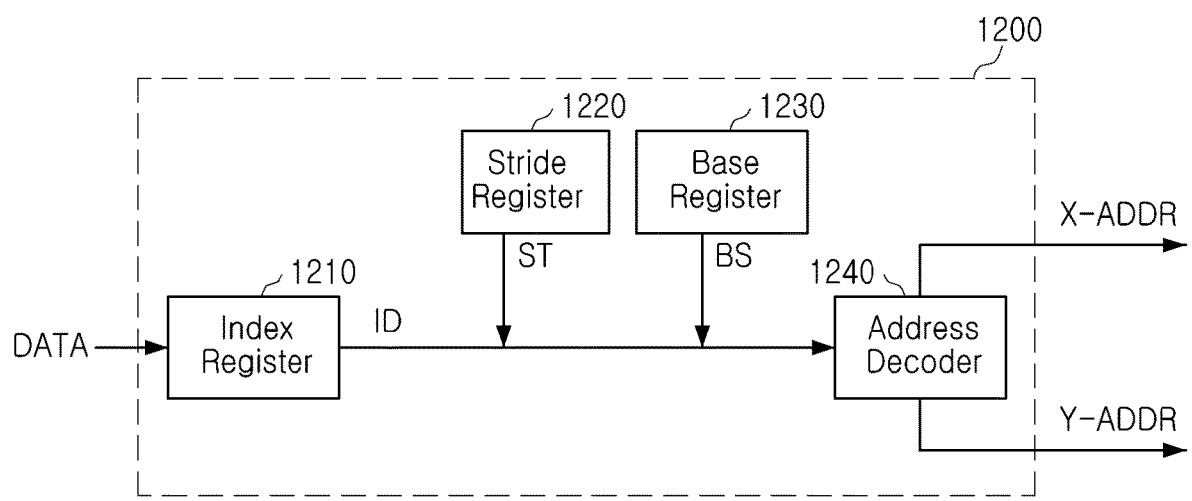
FIG. 13 is a diagram schematically illustrating an address generating unit included in a memory device according to example embodiments of the present inventive concept.

FIG. 13 is a diagram schematically illustrating an address generating unit included in a memory device according to an example embodiment of the present inventive concept.

Referring to FIG. 13, the address generating unit 1200 according to example embodiments of the present inventive concept may include an index register 1210, a stride register 1220, a base register 1230, and an address decoder 1240. As an example, FIG. 13 may be a schematic diagram of the address generating unit 1021 illustrated in FIG. 11. Hereinafter, it will be described with reference to FIG. 11.

The structure and/or operation of the index register 1210, the stride register 1220, and the base register 1230 may be similar to those of the example embodiments described with reference to FIG. 9.

Compared to FIG. 9, the index register 810 may store information corresponding to a row address for a row in which data to be read in the bank 1010 exists and information corresponding to a column address for a column in which data to be read in the bank 1010 exists. The address decoder 840 may receive the value obtained by arithmetically operating the index value ID, the stride value ST, and the base value BS and output the internal row address X-ADDR and the internal column address Y-ADDR.

As previously described with reference to FIG. 4, the address generating unit 1200 illustrated in FIG. 13 may generate the internal row address X-ADDR and the internal column address Y-ADDR using the index value ID, the stride value ST, and the base value BS, rather than storing all the row addresses of a row to be accessed and column addresses of a column to be accessed, thereby reducing the amount of data stored in the address generating unit 1200.

Figure 14:
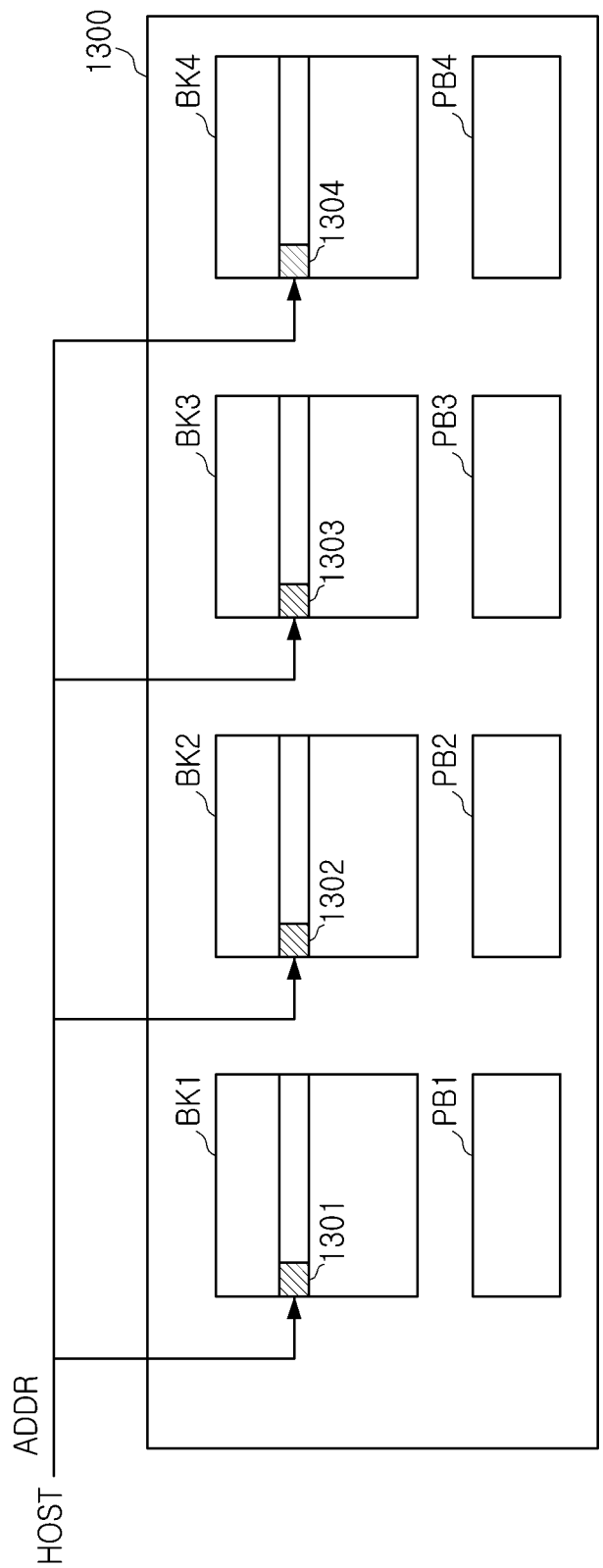
FIG. 14 is a diagram illustrating an operation of a memory device according to example embodiments of the present inventive concept.

FIG. 14 is a diagram illustrating an operation of a memory device according to example embodiments of the present inventive concept.

Referring to FIG. 14, a memory device 1300 according to example embodiments of the present inventive concept may include a plurality of banks BK1 to BK4 and a plurality of PIM blocks PB1 to PB4. Each of the plurality of banks BK1 to BK4 may include a memory cell array, and each of the plurality of PIM blocks PB1 to PB4 may perform an arithmetic operation or the like using data acquired from at least one of the plurality of banks BK1 to BK4 respectively corresponding to the plurality of PIM blocks PB1 to PB4.

When the plurality of banks BK1 to BK4 receive the address ADDR from the external host HOST without receiving the internal address generated by each of the plurality of PIM blocks PB1 to PB4, the same row and the same column of each of the plurality of banks BK_1 to BK_N may be accessed.

For example, when data to be read from the first bank BK1 is stored in a predetermined memory cell 1301, the external host HOST may provide an address ADDR corresponding to the predetermined memory cell. At this time, in the remaining banks BK2 to BK4, even though data to be read does not exist in the memory cells 1302 to 1304 located at the same position as the memory cell 1301 accessed in the first bank BK1, the corresponding memory cells 1302 to 1304 are accessed.

As such, when data to be accessed for each of the plurality of banks BK1 to BK4 is stored in different memory cells, inefficiencies may occur in the time required for a read operation and power consumption of the memory device.

Figure 15:
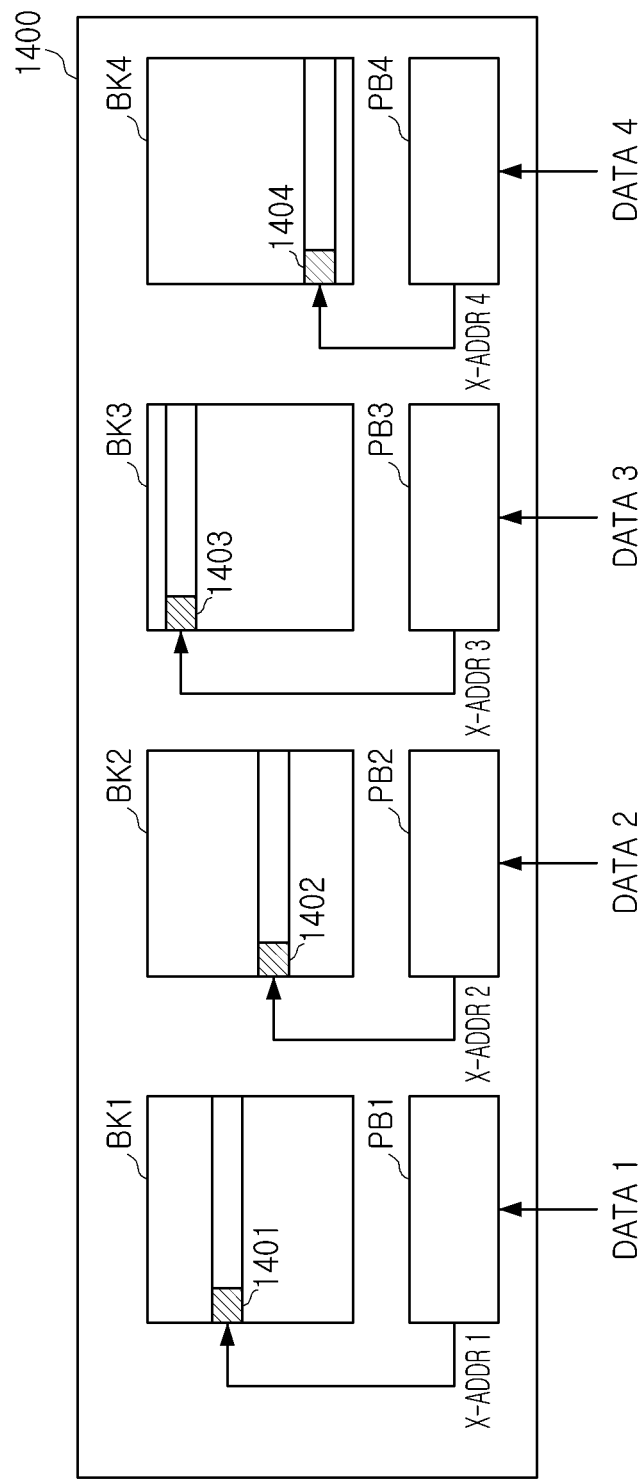
FIGS. 15 and 16 are diagrams illustrating an operation of a memory device according to example embodiments of the present inventive concept.
Figure 16:
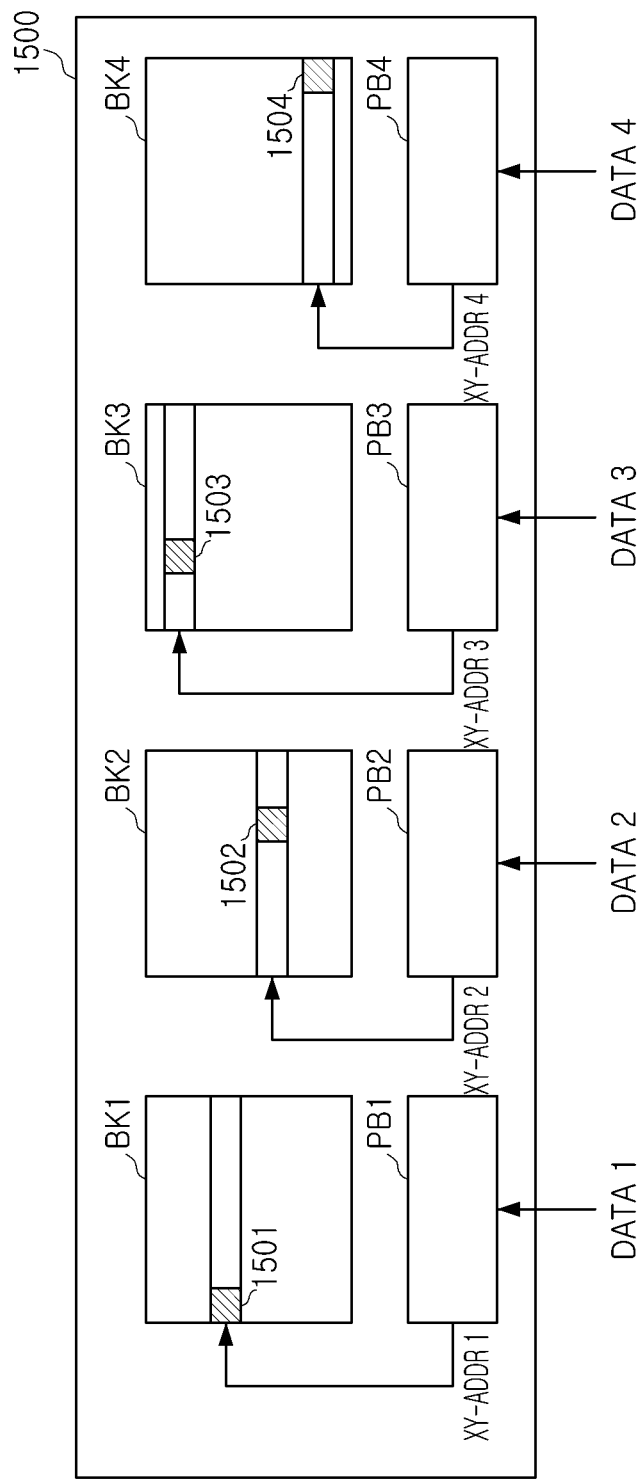

FIGS. 15 and 16 are diagrams schematically illustrating operations of a memory device according to example embodiments of the present inventive concept.

Each of the plurality of banks BK1 to BK4 may be allocated to and disposed in one of the plurality of PIM blocks PB1 to PB4. However, the present inventive concept is not limited thereto, and the number of PIM blocks PB1 to PB4 that may be allocated to each of the plurality of banks BK1 to BK4 may vary according to example embodiments.

Referring first to FIG. 15, a memory device 1400 according to example embodiments of the present inventive concept may include a plurality of banks BK1 to BK4 and a plurality of PIM blocks PB1 to PB4. For example, the plurality of banks BK1 to BK4 and the plurality of PIM blocks PB1 to PB4 illustrated in FIG. 15 may be implemented according to at least one of the example embodiments described above with reference to FIGS. 2 to 10.

Each of the plurality of PIM blocks PB1 to PB4 may be provided with data DATA1 to DATA4 from an external host and at least one of banks respectively corresponding to the plurality of PIM blocks PB1 to PB4. Data DATA1 to DATA4 received by each of the plurality of PIM blocks PB1 to PB4 may be different from each other, and thus, each of the plurality of PIM blocks PB1 to PB4 may provide different internal row addresses X-ADDR1 to X-ADDR4 to the plurality of banks BK1 to BK4 respectively corresponding to the plurality of PIM blocks PB1 to PB4. Accordingly, each of the plurality of banks BK1 to BK4 may access the memory cells 1401 to 1404 existing in different rows and different columns at the same time.

The operation of generating the internal row addresses X-ADDR1 to X-ADDR4 using the data DATA1 to DATA4 in the plurality of PIM blocks PB1 to PB4 may be understood with reference to the example embodiments described above with reference to FIGS. 2 to 10.

Referring to FIG. 16, a memory device 1500 according to example embodiments of the present inventive concept may include a plurality of banks BK1 to BK4 and a plurality of PIM blocks PB1 to PB4. For example, the plurality of banks BK1 to BK4 and the plurality of PIM blocks PB1 to PB4 illustrated in FIG. 16 may be implemented according to at least one of the example embodiments described with reference to FIGS. 11 to 13 above.

The plurality of PIM blocks PB1 to PB4 may be provided with data DATA1 to DATA4 from an external host and at least one of banks respectively corresponding to the plurality of PIM blocks PB1 to PB4. The data DATA1 to DATA4 received by the plurality of PIM blocks PB1 to PB4 may be different from each other.

Accordingly, the plurality of PIM blocks PB1 to PB4 may provide different addresses XY-ADDR1 to XY-ADDR4 including different internal row addresses and different internal column addresses to the plurality of banks BK1 to BK4 respectively corresponding to plurality of PIM blocks PB1 to PB4. The plurality of banks BK1 to BK4 may respectively access the memory cells 1501 to 1504 different in rows and/or columns by referring to different addresses XY-ADDR1 to XY-ADDR4 provided respectively from the plurality of PIM blocks PB1 to PB4.

An operation of generating an address using the plurality of data DATA1 to DATA4 respectively in the plurality of PIM blocks PB1 to PB4 may be understood with reference to the example embodiments described above with reference to FIGS. 11 to 13.

Figure 17:
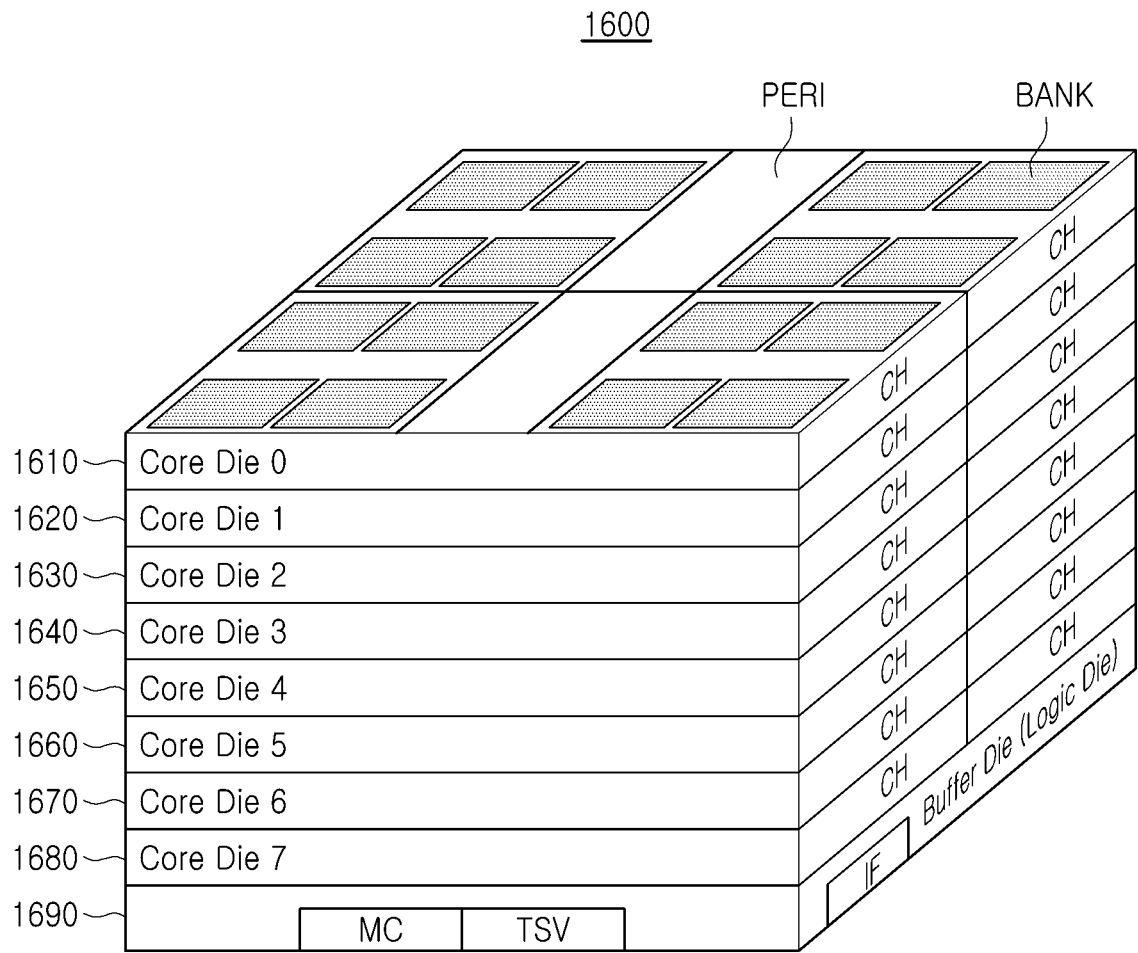
FIG. 17 is a diagram schematically illustrating a memory device according to example embodiments of the present inventive concept.

FIG. 17 is a diagram schematically illustrating a memory device according to example embodiments of the present inventive concept.

Referring to FIG. 17, a memory device according to example embodiments of the present inventive concept may be a high bandwidth memory device 1600. The high bandwidth memory device 1600 may include a plurality of core dies 1610 to 1680 and a buffer die 1690. In FIG. 17, eight core dies 1610 to 1680 and one core die are illustrated as being connected to each other through two channels, but the present inventive concept is not limited thereto and the number of core dies 1610 to 1680 and the number of channels CH connecting the core dies 1610 to 1680 and the buffer die 1690 in one high bandwidth memory device 1600 may vary according to example embodiments.

Each of the plurality of core dies 1610 to 1680 may include a peripheral circuit region PERI and a plurality of banks BANK, and the buffer die 1690 may include a memory controller MC and a TSV region TSV, and an interface circuit IF.

Each of the plurality of banks BANK may include a row decoder, a column decoder, and a memory cell array including a plurality of memory cells.

Each of the plurality of banks BANK may include a plurality of word lines disposed in a row direction and a plurality of bit lines disposed in a column direction. The plurality of memory cells may be connected to the row decoder through word lines and may be connected to the column decoder through bit lines.

The peripheral circuit region PERI may include a control logic, an input/output circuit, and a plurality of PIM blocks. The control logic may receive an address and a control command through the input/output circuit, and the input/output circuit may be connected to the TSV region TSV through a through-silicon via.

For example, each of the plurality of PIM blocks included in the peripheral circuit region PERI may be implemented according to at least one of the PIM blocks described above with reference to FIGS. 1 to 16.

The buffer die 1690 may receive at least one of a control command, an address, and data from an external host through the interface circuit IF. The TSV region TSV may be a region in which a through-silicon via is formed for communication between the external host and the core dies 1610 to 1680.

As described above, the plurality of PIM blocks included in the peripheral circuit region PERI may acquire data from an external host and at least one of the plurality of banks and generate at least one of a row address and a column address for the banks respectively corresponding to the plurality of PIM blocks using the acquired data. Accordingly, data stored in different locations in each of the plurality of banks BANK may be accessed at the same time.

According to example embodiments of the present inventive concept, an address for banks corresponding to a plurality of PIM blocks included in a memory device may be independently generated. Since a plurality of banks receive addresses individually generated by the PIM blocks respectively corresponding to the plurality of banks according to a mode, data access patterns may be varied. In addition, since data stored in different rows of each of the plurality of banks may be read at the same time, a time required for the operation of the memory device may be shortened, an arithmetic processing speed of the PIM block may be improved, and power consumption may be improved.

What is claimed is:

1. A memory device comprising:
    a memory bank comprising a plurality of banks that comprise memory cells; and
    a PIM (processing in memory) circuit comprising a plurality of PIM blocks, each of the PIM blocks comprising an arithmetic logic unit (ALU) configured to perform an arithmetic operation using internal data acquired from at least one of the plurality of banks or an address generating unit,
    wherein the plurality of PIM blocks comprises a first PIM block allocated to at least one first bank and a second PIM block allocated to at least one second bank,
    wherein the address generating unit of the first PIM block is configured to generate a first internal row address for the at least one first bank,
    wherein the address generating unit of the second PIM block is configured to generate a second internal row address for the at least one second bank,
    wherein the first internal row address and the second internal row address indicate different rows,
    wherein the address generating unit of the first PIM block is configured to generate a first internal column address for the at least one first bank, and the address generating unit of the second PIM block is configured to generate a second internal column address for the at least one second bank, and
    wherein the first internal column address and the second internal column address indicate respective columns different from each other.

2. The memory device of claim 1, wherein the address generating unit is configured to receive information on a row address for at least one of the plurality of banks from an external host through a pad that exchanges a data signal with the external host.

3. The memory device of claim 1, wherein the address generating unit is configured to receive information on a row address for the bank that provides internal data using the internal data acquired from at least one of the plurality of banks.

4. The memory device of claim 1, further comprising:
    a first multiplexer that is configured to select an address out of the first internal row address or an external row address received from an external host, and configured to output the address that was selected to the at least one first bank,
    wherein the first PIM block further comprises a mode register that is configured to store mode information, and
    wherein the first multiplexer is configured to select an address out of the first internal row address and the external row address based on the mode information from the mode register.

5. The memory device of claim 4,
    wherein when accessing a same row in each of the plurality of banks, the first multiplexer is configured to select the external row address, and
    wherein when accessing a different row in each of the plurality of banks, the first multiplexer is configured to select the first internal row address.

6. The memory device of claim 1,
    wherein the first PIM block comprises a storage register configured to store at least one of external data received from an external host or the internal data received from the at least one first bank, and wherein the address generating unit of the first PIM block is configured to generate the first internal row address based on data stored in the storage register.

7. The memory device of claim 1, wherein the address generating unit of the first PIM block comprises an offset register configured to store offset information, configured to receive a reference address and a control command from an external host, and configured to generate the internal row address based on the reference address and the offset information.

8. The memory device of claim 1,
wherein the address generating unit of the first PIM block comprises an index register, a stride register, a base register, and an address decoder, and
wherein the address decoder is configured to output the first internal row address based on an index value stored in the index register, a stride value stored in the stride register, and a base value stored in the base register.

9. The memory device of claim 8, wherein the address decoder is configured to output the first internal row address based on a value obtained by adding the base value to a value obtained by multiplying the index value by the stride value.

10. The memory device of claim 1,
wherein the address generating unit of the first PIM block comprises an address register configured to store information on the first internal row address and an address decoder, and
wherein the address decoder is configured to output the first internal row address based on data stored in the address register.

11. The memory device of claim 1, further comprising:
a first multiplexer configured to select an address that is one of an external row address from an external host or the first internal row address, and configured to output the address that was selected to the at least one first bank; and
a second multiplexer configured to select an address that is one of an external column address from the external host or the first internal column address, and configured to output the address that was selected to the at least one first bank,
wherein the first PIM block further comprises a mode register is configured to store mode information,
wherein the first multiplexer is configured to select one of the external row address or the first internal row address based on the mode information, and
wherein the second multiplexer is configured to select one of the external column address or the first internal column address based on the mode information.

12. The memory device of claim 11,
wherein when accessing a same row and a same column in each of the plurality of banks, the first multiplexer is configured to select the external row address and the second multiplexer is configured to select the external column address, and
wherein when accessing different rows and different columns in each of the plurality of banks, the first multiplexer is configured to select the first internal row address and the second multiplexer is configured to select the first internal column address.

13. The memory device of claim 1, wherein at least two banks, among the plurality of banks, share one of the plurality of PIM blocks.

14. A memory device comprising:
a memory bank comprising at least one bank that comprises memory cells;
a PIM (processing in memory) circuit comprising a plurality of PIM blocks configured to perform arithmetic processing using at least one of external data received from an external host or internal data received from the memory bank;
a control logic configured to control the memory bank and the PIM circuit; and
a multiplexer configured to receive at least one of an external row address from the external host or an internal row address from the plurality of PIM blocks,
wherein each of the plurality of PIM blocks is connected to at least one bank among the banks, is configured to generate the internal row address for the at least one bank that is connected, and is configured to access a different row of each of the at least one bank with the internal row address,
wherein each of the plurality of PIM blocks comprises an address generating unit configured to generate the internal row address, and
wherein the address generating unit is configured to generate the internal row address using at least one of external data received from the external host or internal data acquired from the memory bank.

15. The memory device of claim 14,
wherein each of the PIM blocks comprises a mode register, and
wherein the multiplexer is configured to output one of the address from the host or an address from the plurality of PIM blocks based on mode information from the mode register.

16. The memory device of claim 14, wherein each of the PIM blocks is configured to generate an internal column address for at least one bank respectively connected to the PIM blocks.

17. The memory device of claim 16, wherein each of the PIM blocks comprises an offset register configured to store an offset address and a reference register configured to store a reference address, and is configured to generate the internal row address and the internal column address based on the offset address and the reference address.

18. A memory device comprising:
a plurality of core dies stacked on each other and connected to each other through a plurality of channels by a plurality of through-silicon vias; and
a buffer die configured to control the plurality of core dies through the plurality of channels,
wherein at least one of the plurality of core dies comprises:
a plurality of banks that each comprises a plurality of memory cells; and
a plurality of PIM (processing in memory) blocks corresponding to the plurality of banks and configured to execute an arithmetic operation using data stored in at least one of the plurality of banks in response to a command received from the buffer die,
wherein each of the plurality of PIM blocks is configured to independently generate a row address for accessing each of the plurality of banks to acquire the data in the arithmetic operation,
wherein each of the plurality of PIM blocks comprises a respective storage register configured to store at least one of external data received from an external host or internal data received from respective ones of the plurality of banks, and wherein each of the plurality of PIM blocks comprises a respective address generating unit configured to generate a respective internal row address based on data stored in the respective storage register.

\* \* \* \* \*